(12) United States Patent
Choi et al.

(10) Patent No.: US 6,259,392 B1
(45) Date of Patent: Jul. 10, 2001

(54) MULTIPLYING DIGITAL-TO-ANALOG CONVERTERS AND METHODS THAT SELECTIVELY CONNECT UNIT AND FEEDBACK CAPACITORS TO REFERENCE VOLTAGES AND FEEDBACK VOLTAGES

(75) Inventors: Hee-Cheol Choi, Seoul; Kwang-Hee Lee, Kyunggi-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/166,813

(22) Filed: Oct. 6, 1998

(30) Foreign Application Priority Data

Oct. 8, 1997 (KR) .................................. 97-51633
Aug. 13, 1998 (KR) .................................. 98-32938

(51) Int. Cl.[7] .............................. H03M 1/66; H03M 1/12
(52) U.S. Cl. .......................................... 341/150; 341/172
(58) Field of Search .................................. 341/144, 155, 341/150, 172, 161, 120

(56) References Cited

U.S. PATENT DOCUMENTS

| | | | | |
|---|---|---|---|---|
| 4,195,282 | * | 3/1980 | Cameron | 340/347 |
| 4,764,750 | * | 8/1988 | Kawada | 340/347 |
| 4,799,042 | * | 1/1989 | Confalonierei et al. | 341/118 |
| 4,937,578 | * | 6/1990 | Shioda | 341/150 |
| 5,416,485 | * | 5/1995 | Lee | 341/172 |
| 5,635,937 | * | 6/1997 | Lim et al. | 341/161 |
| 5,852,415 | * | 12/1998 | Cotter et al. | 341/120 |
| 5,977,894 | * | 11/1999 | McCarroll et al. | 341/120 |
| 6,144,331 | * | 11/2000 | Jiang | 341/172 |

OTHER PUBLICATIONS

Yu et al., "A Pipelined A/D Conversion Technique with Near–Inherent Monotonicity", IEEE Transactions on Circuits and Systems–II: Analog and Digital Signal Processing, vol. 42, No. 7, Jul. 1995, pp. 500–502.

* cited by examiner

*Primary Examiner*—Peguy Jeanpierre
(74) *Attorney, Agent, or Firm*—Myers Bigel Sibley & Sajovec

(57) ABSTRACT

Multiplying Digital-to-Analog Converters (MDAC) multiply an analog input signal at an analog input terminal and a digital input signal at a digital input terminal to produce an analog output signal at an output terminal. The MDACs include unit capacitors and a feedback capacitor. The unit capacitors are connected to the analog input terminal during a first time interval and the unit capacitors are selectively connected to a first reference voltage, a second reference voltage or the output terminal during a second time interval in response to the digital input signal at the digital input terminal. The feedback capacitor is connected to the second reference voltage during the first time interval and to the output terminal during the second time interval.

31 Claims, 10 Drawing Sheets

|     | $c_8$ | $c_7$ | $c_6$ | $c_5$ | $c_4$ | $c_3$ | $c_2$ | $c_1$ | $c_0$ |
|-----|-----|-----|------|------|------|------|------|------|------|
| 111 | F/B | F/B | Vref | Vref | Vref | Vref | Vref | Vref | Vref |
| 110 | F/B | F/B | GND  | Vref | Vref | Vref | Vref | Vref | Vref |
| 101 | F/B | F/B | GND  | GND  | Vref | Vref | Vref | Vref | Vref |
| 100 | F/B | F/B | GND  | GND  | GND  | Vref | Vref | Vref | Vref |
| 011 | F/B | F/B | GND  | GND  | GND  | GND  | Vref | Vref | Vref |
| 010 | F/B | F/B | GND  | GND  | GND  | GND  | GND  | Vref | Vref |
| 001 | F/B | F/B | GND  | GND  | GND  | GND  | GND  | GND  | Vref |
| 000 | F/B | F/B | GND  | GND  | GND  | GND  | GND  | GND  | GND  |

Fig. 5
(Prior Art)

|     | $C_8$ | $C_7$ | $C_6$ | $C_5$ | $C_4$ | $C_3$ | $C_2$ | $C_1$ |
|-----|-----|-----|-----|-----|-----|-----|-----|-----|
| 111 | F/B | Vref | Vref | Vref | Vref | Vref | Vref | Vref |
| 110 | GND | F/B | Vref | Vref | Vref | Vref | Vref | Vref |
| 101 | GND | GND | F/B | Vref | Vref | Vref | Vref | Vref |
| 100 | GND | GND | GND | F/B | Vref | Vref | Vref | Vref |
| 011 | GND | GND | GND | GND | F/B | Vref | Vref | Vref |
| 010 | GND | GND | GND | GND | GND | F/B | Vref | Vref |
| 001 | GND | GND | GND | GND | GND | GND | F/B | Vref |
| 000 | GND | GND | GND | GND | GND | GND | GND | F/B |

Fig. 8

|     | $C_4$ | $C_3$ | $C_2$ | $C_1$ | $C_0$ |
|-----|-------|-------|-------|-------|-------|
| 11  | F/B   | Vref  | Vref  | Vref  | F/B   |
| 10  | GND   | F/B   | Vref  | Vref  | F/B   |
| 01  | GND   | GND   | F/B   | Vref  | F/B   |
| 00  | GND   | GND   | GND   | F/B   | F/B   |

Fig. 9

|     | $C_8$ | $C_7$ | $C_6$ | $C_5$ | $C_4$ | $C_3$ | $C_2$ | $C_1$ | $C_0$ |
|-----|-------|-------|-------|-------|-------|-------|-------|-------|-------|
| 111 | F/B   | Vref  | Vref  | Vref  | Vref  | Vref  | Vref  | Vref  | F/B   |
| 110 | GND   | F/B   | Vref  | Vref  | Vref  | Vref  | Vref  | Vref  | F/B   |
| 101 | GND   | GND   | F/B   | Vref  | Vref  | Vref  | Vref  | Vref  | F/B   |
| 100 | GND   | GND   | GND   | F/B   | Vref  | Vref  | Vref  | Vref  | F/B   |
| 011 | GND   | GND   | GND   | GND   | F/B   | Vref  | Vref  | Vref  | F/B   |
| 010 | GND   | GND   | GND   | GND   | GND   | F/B   | Vref  | Vref  | F/B   |
| 001 | GND   | GND   | GND   | GND   | GND   | GND   | F/B   | Vref  | F/B   |
| 000 | GND   | GND   | GND   | GND   | GND   | GND   | GND   | F/B   | F/B   |

Fig.11

|    | $C_4$ | $C_3$ | $C_2$ | $C_1$ |
|----|-------|-------|-------|-------|
| 11 | F/B   | Vref  | Vref  | Vref  |
| 10 | GND   | F/B   | Vref  | Vref  |
| 01 | Vref  | F/B   | GND   | GND   |
| 00 | F/B   | GND   | GND   | F/B   |

Fig.12

|     | $C_8$ | $C_7$ | $C_6$ | $C_5$ | $C_4$ | $C_3$ | $C_2$ | $C_1$ |
|-----|-------|-------|-------|-------|-------|-------|-------|-------|
| 111 | F/B   | Vref  | Vref  | Vref  | Vref  | Vref  | Vref  | Vref  |
| 110 | GND   | F/B   | Vref  | Vref  | Vref  | Vref  | Vref  | Vref  |
| 101 | GND   | GND   | F/B   | Vref  | Vref  | Vref  | Vref  | Vref  |
| 100 | GND   | GND   | GND   | F/B   | Vref  | Vref  | Vref  | Vref  |
| 011 | Vref  | Vref  | Vref  | F/B   | GND   | GND   | GND   | GND   |
| 010 | Vref  | Vref  | F/B   | GND   | GND   | GND   | GND   | GND   |
| 001 | Vref  | F/B   | GND   | GND   | GND   | GND   | GND   | GND   |
| 000 | F/B   | GND   | GND   | GND   | GND   | GND   | GND   | GND   |

US 6,259,392 B1

MULTIPLYING DIGITAL-TO-ANALOG CONVERTERS AND METHODS THAT SELECTIVELY CONNECT UNIT AND FEEDBACK CAPACITORS TO REFERENCE VOLTAGES AND FEEDBACK VOLTAGES

FIELD OF THE INVENTION

This invention relates to digital-to-analog converters and converting methods, and more particularly to multiplying digital-to-analog converters and methods and pipelined analog-to-digital converters and methods using the same.

BACKGROUND OF THE INVENTION

Multiplying Digital-to-Analog Converters (MDAC) and converting methods are widely used in electronic systems to multiply an analog input signal at an analog input terminal and a digital input signal at a digital input terminal, to produce an analog output signal at an analog output terminal. For example, MDACs are widely used as a component of a pipelined analog-to-digital converter (ADC). As is well known to those having skill in the art, a pipelined ADC employs a plurality of MDACs that are serially connected, such that the analog output terminal of a preceding MDAC is connected to the analog input terminal of a succeeding MDAC. A pipelined ADC also uses a plurality of ADCs, a respective one of which is connected between the analog input terminal and the digital input terminal of a respective one of the MDACs. Pipelined ADCs are widely used, for example for high-speed data processing in high definition television, image recognition, radar and medical instrument systems.

Unfortunately, it may be difficult to match the various elements of a pipelined ADC in order to maintain a high degree of linearity. In order to match these elements, self-calibration, error averaging and laser trimming techniques have been employed in the design and manufacture of pipelined ADCs. Notwithstanding these developments, linearity may continue to be a problem in pipelined ADCs.

Referring now to FIG. 1, a pipelined ADC 100 comprises MDACs 110, 130 and 150, ADCs 120, 140, 160 and 180, and a correction and data output circuit 190 that corrects the data output from the ADCs 120, 140, 160, 180 to generate the corrected digital output data DO. An external analog signal AI1 is input to the first ADC 120 and to the first MDAC 110. The first ADC 120 converts the external analog signal AI1 into first digital data DDI1 that is applied to the first input d1 of the correction and data output circuit 190 and to the first MDAC 110. The first MDAC 110 amplifies the difference between the external analog signal AI1 and the first digital data DDI1 to generate a first multiplied analog signal AI2.

Similarly, the multiplied analog signal AI2 is input to the second ADC 140 and to the second MDAC 130. The second ADC 140 converts the first multiplied analog signal AI2 into second digital data DDI2 that is applied to the second input d2 of the correction and data output circuit 190 and to the second MDAC 130. The second MDAC 130 amplifies the difference between the first multiplied analog signal AI2 and the second digital data DDI2 to generate a second multiplied analog signal AI3.

Likewise, the second multiplied signal AI3 is input to the third ADC 160 and to the third MDAC 150. The third ADC 160 converts the second multiplied analog signal AI3 into third digital data DDI3 that is applied to the third input d3 of the correction and data output circuit 190 and to the third MDAC 150. This third MDAC 130 amplifies the difference between the second multiplied analog signal AI3 and the third digital data DDI3 to generate a third multiplied analog signal AI4 that is applied to the fourth ADC 180. The fourth ADC 180 converts the third multiplied analog signal AI4 into fourth digital data that is applied to the fourth input d4 of the correction and data output circuit 190. Finally, the correction and data output circuit 190 corrects the second to fourth digital data received through the second to fourth inputs d2 to d4 based on the first digital data received through the first input d1, to generate the digital output data DO.

Referring to FIG. 2, an N-bit MDAC 120–180 that can be used in a pipelined ADC as shown in FIG. 1, comprises a plurality of switches, a capacitor array and an operational amplifier. When a first clock pulse is generated, the MDAC samples the analog input signal to the capacitors. When a second clock pulse is generated, the switches are selectively connected to the reference voltage Vref, the feedback line F/B or ground GND according to the digital data obtained from the input analog signal, to amplify the residue voltage which is the difference between the values of the analog signal and the digital data. The MDAC may employ a fixed feedback capacitor and/or a rearrangement feedback capacitor. The MDAC shown in FIG. 2 employs both fixed feedback capacitors and rearrangement feedback capacitors. Such a pipelined ADC is disclosed in an article entitled "Pipelined A-D Conversion Technique with Near-Inherent Monotonicity", IEEE Vol. 42, pp. 500–502, July 1995, the disclosure of which is hereby incorporated herein by reference.

The conventional MDAC uses two fixed feedback capacitors $C_7$ and $C_8$. Reference symbol C represents a unit capacitor. Vref represents a first reference voltage and GND represents a second reference voltage such as ground voltage. The analog input signal corresponds to digital data from 000 to 111. This MDAC structure establishes a code pattern, as shown in FIGS. 3 and 4, which includes 4 nominal ranges and 4 error correction ranges (2 add ranges and 2 subtract ranges) to correct the errors occurring in the other flash ADC blocks. Hence, it is possible to correct the errors with over 4 bits precision in the flash blocks.

In such an MDAC, the overall errors that may occur due to the capacitor error are expressed by means of Vdrop (generally 1–2 $V_{ref}$), and the linearity difference is expressed by DNL (Differential Non-Linearity) in the following Equations, which represent the values of the Vdrops in the transition from 000 to 111. In the Equations, $V_1$ represents a residue peak voltage, and $V_2$ represents a residue bottom voltage. Vdrop represents the difference between $V_1$ and $V_2$, i.e., the residue drop.

$$C_T = \frac{1}{9}(C_0 + C_1 + C_2 + C_3 + C_4 + C_5 + C_6 + C_7 + C_8) \qquad (1)$$

$$C_i = C(1+\epsilon_i), I = 0, 1, 2, \ldots, 8 \qquad (2)$$

$$V_1 = 8\frac{C}{C(2+\epsilon_7+\epsilon_8)} \times \frac{Vref}{8} = \frac{Vref}{2+\epsilon_7+\epsilon_8} \qquad (3)$$

$$V_2 = 8\frac{C}{2+\epsilon_8+\epsilon_7} \times \frac{Vref}{8} - \frac{1+\epsilon_0}{2+\epsilon_8+\epsilon_7}Vref = -\epsilon_0\frac{Vref}{2+\epsilon_8+\epsilon_7} \qquad (4)$$

$$V_{drop} = V1 - V2 = \frac{Vref}{2+\epsilon_8+\epsilon_7} - \frac{-\epsilon_0 Vref}{2+\epsilon_8+\epsilon_7} = \qquad (5)$$
$$\frac{(1+\epsilon_0)Vref}{2+\epsilon_8+\epsilon_7} = \frac{1}{2}\left(1+\epsilon_0 - \frac{1}{2}\epsilon_8 - \frac{1}{2}\epsilon_7\right)Vref$$

This MDAC can also employ a rearrangement feedback capacitor without using a fixed feedback capacitor, to produce a code pattern as shown in FIG. 5. The error Vdrop of such structure may be obtained by the following Equations:

$$V_1 = 8\frac{C}{C(1+\varepsilon_1)} \times \frac{1}{8} Vref = \frac{1}{1+\varepsilon_2} Vref \qquad (6)$$

$$V_2 = \frac{Vref}{C(1+\varepsilon_2)} - \frac{C(1+\varepsilon_1)}{C(1+\varepsilon_2)} Vref = -\frac{\varepsilon_1}{1+\varepsilon_2} Vref \qquad (7)$$

$$V_{drop} = V_1 - V_2 = \frac{Vref}{1+\varepsilon_1} + \frac{\varepsilon_1}{1+\varepsilon_2} Vref = \qquad (8)$$

$$Vrefx \frac{1+\varepsilon_2+\varepsilon_1+\varepsilon_1^2}{1+\varepsilon_1+\varepsilon_2+\varepsilon_1\varepsilon_2} = Vref(1+\varepsilon_1^2-\varepsilon_1\varepsilon_2)$$

According to Eq. 5, the primary error factor $\epsilon_0$ is eliminated but the secondary error factor may not be eliminated. Constructing a pipelined ADC by using such MDAC structure, the code pattern proceeds as shown in FIG. 6. This results in 8 nominal ranges with 2 error correction ranges (1 add and 1 subtract range), thereby reducing the error correction region. However, the precision may be limited to 6 bits for the ADC blocks. In this case, while the capacitor array of the MDAC with the fixed feedback does not limit the precision over 4 bits, the value of the capacitor array may inherently have an error in the divisor as shown in Eq. 5. The third and fourth terms of the divisor may be minimized in designing the MDAC, but the second term $\epsilon_0$ inherently belongs to all the capacitors, and may be difficult to eliminate. Alternatively, in the capacitor array of the MDAC only with the unit capacitors, the precision may not be limited over 6 bits. As shown by Eq. 8, the primary error factor may be eliminated, but the secondary error factors may remain.

SUMMARY OF THE INVENTION

It is therefore an object of the present invention to provide multiplying digital-to-analog converters and converting methods that can include reduced capacitor errors.

It is another object of the present invention to provide pipelined analog-to-digital converters and converting methods that can include reduced capacitor errors.

These and other objects are provided according to the present invention by Multiplying Digital-to-Analog Converters (MDAC) that multiply an analog input signal at an analog input terminal and a digital input signal at a digital input terminal to produce an analog output signal at an output terminal. The MDACs comprise a plurality of unit capacitors and a feedback capacitor. The unit capacitors are connected to the analog input terminal during a first time interval and the unit capacitors are selectively connected to one of a first reference voltage, a second reference voltage and the output terminal during a second time interval in response to the digital input signal at the digital input terminal. The feedback capacitor is connected to the second reference voltage during the first time interval and to the output terminal during the second time interval.

Preferred embodiments of MDACs and methods according to the invention include a plurality of first switches, a respective one of which connects a respective unit capacitor to the analog input terminal during the first time interval. A plurality of second switches is also provided. A respective one of the first switches connects a respective one of the unit capacitors to a respective one of the second switches during the second time interval. The second switches are selectively connected to one of the first reference voltage, the second reference voltage and the output terminal during the second time interval in response to the digital input signal at the digital input terminal. More preferably, one of the second switches is connected to the output terminal and remaining ones of the second switches are connected to one of the first reference voltage and the second reference voltage during the second time interval in response to the digital input signal at the digital input terminal.

Most preferably, the second switches are arranged from a most significant bit to a least significant bit. The second reference voltage is ground voltage and a selected one of the second switches that corresponds to the digital input signal is connected to the output terminal. More significant second switches than the selected switch are connected to ground voltage and less significant second switches than the selected switch are connected to the first reference voltage. Specifically, for an N bit digital input signal, $2^N$ capacitors, $2^N$ first switches and $2^N$ second switches are provided. The $2^N$ second switches are arranged from a most significant bit to a least significant bit. A selected one of the $2^N$ second switches that corresponds to the value of the N bit digital input signal is connected to the output terminal. The second switches that are more significant than the selected one of the $2^N$ second switches are connected to ground voltage and the second switches that are less significant than the selected one of the $2^N$ second switches are connected to the first reference voltage during a second time interval.

An operational amplifier may also be provided in MDACs according to the invention. The operational amplifier connects the plurality of unit capacitors and the feedback capacitor to the output terminal. The feedback capacitor is preferably connected between the operational amplifier and the second reference voltage during a first time interval and is connected between the operational amplifier and the output terminal during the second time interval.

Pipelined Analog-to-Digital Converter (ADC) systems and methods according to the present invention include a plurality of MDACs, each of which multiplies an analog input signal at an analog input terminal thereof at a digital input signal at a digital input terminal thereof to produce an analog output signal at an output terminal thereof. The MDACs are serially connected such as the analog output terminal of a preceding MDAC is connected to the analog input terminal of a succeeding MDAC. A plurality of ADCs are also provided, a respective one of which is connected between the analog input terminal and the digital input terminal of a respective one of the MDACs. Each of the MDACs may include the elements and perform the steps as described above.

According to another aspect of the present invention, MDAC systems and methods include $2^N$ capacitors that are arranged from a most significant bit to a least significant bit of the N bit digital input signal. The $2^N$ capacitors are connected to the analog input terminal during a first time interval. One of the $2^N/2$ most significant capacitors is selectively connected to the output terminal during a second time interval in response to the N bit digital input signal at the digital input terminal. The more significant capacitors are connected to a first reference voltage and the less significant capacitors are connected to a second reference voltage, or the more significant capacitors are connected to the second reference voltage and the less significant capacitors are connected to the first reference voltage, during the second time interval in response to the N bit digital input signal at the digital input terminal.

Preferably, the more significant capacitors are connected to the first reference voltage and the less significant capacitors are connected to a second reference voltage, or the more significant capacitors are connected to the second reference voltage and the less significant capacitors are connected to the first reference voltage, in response to the most significant bit of the N bit digital input signal. These connections may be implemented by $2^N$ first switches, $2^N$ second switches and controlling circuits and methods. Improved MDAC systems and methods and ADC systems and methods having reduced capacitor errors may therefore be provided.

BRIEF DESCRIPTION OF THE DRAWINGS

FIG. 5 is a table illustrating a connection of the capacitor array used in a conventional 3-bit MDAC;

FIG. 8 is a table illustrating a connection of a capacitor array of 2-bit MDACs according to the present invention;

FIG. 9 is a table illustrating a connection of a capacitor array of 3-bit MDACs according to the present invention;

FIG. 11 is a table illustrating a connection of a unit capacitor array of 2-bit MDACs according to the present invention;

FIG. 12 is a table illustrating a connection of a unit capacitor array of 3-bit MDACs shown in FIG. 10.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
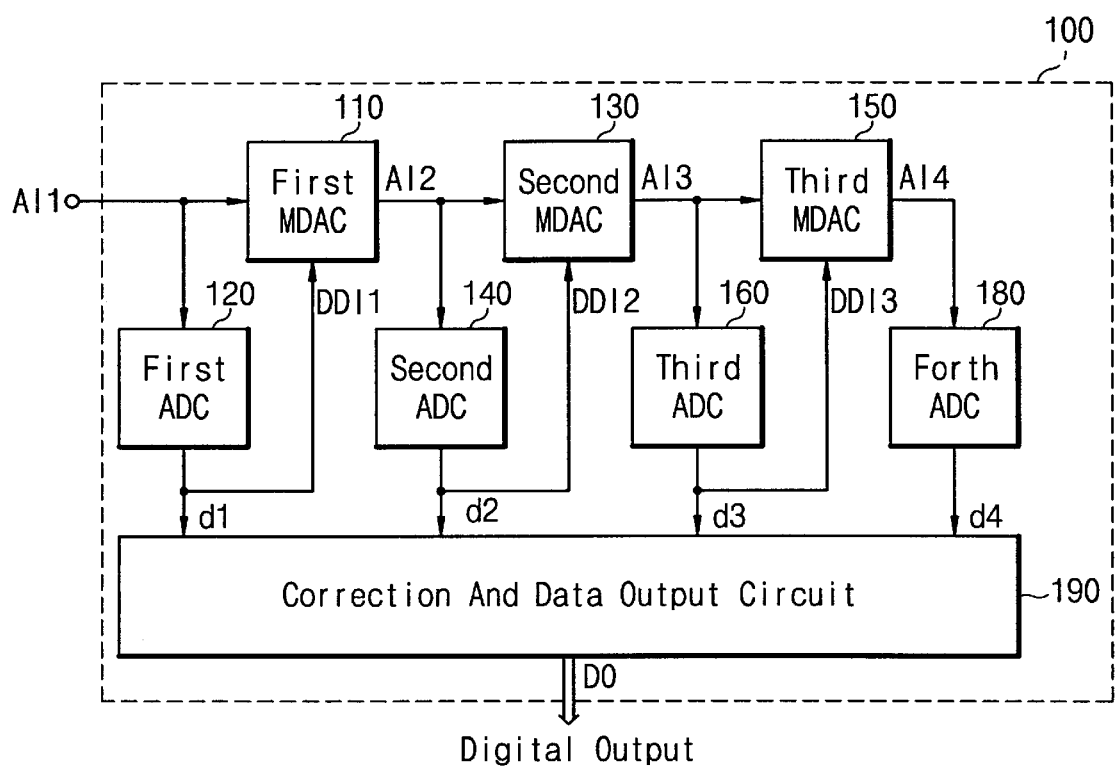
FIG. 1 is a block diagram illustrating a conventional pipelined ADC.
Figure 2:
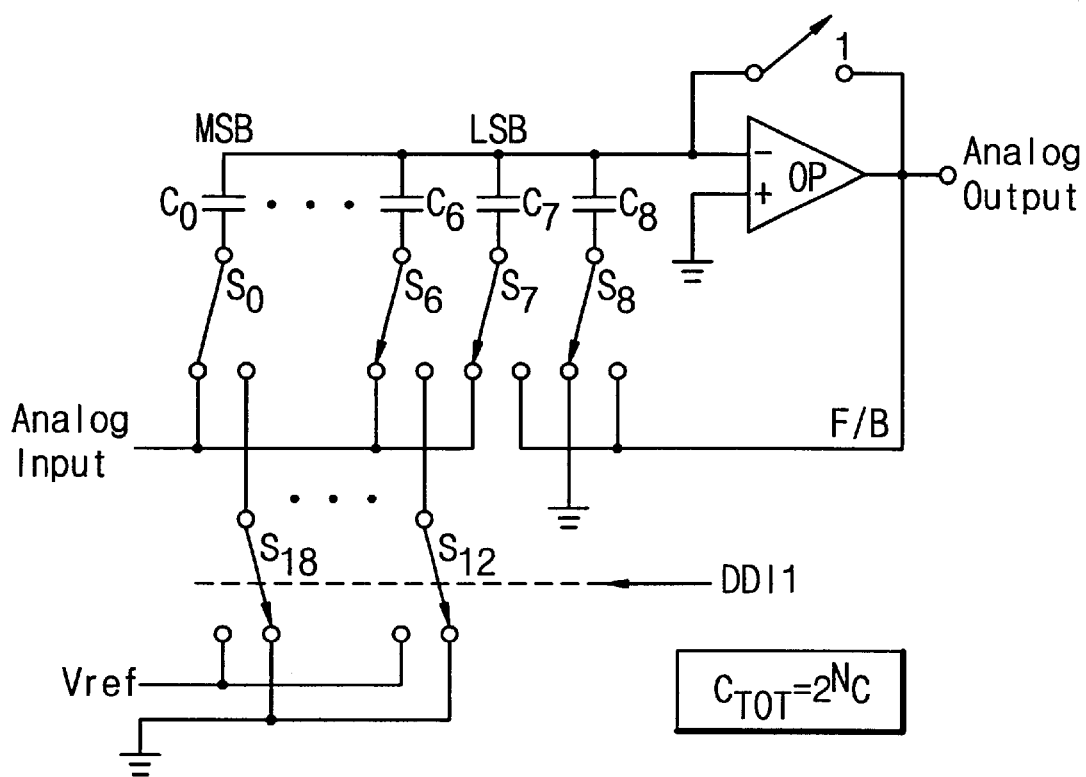
FIG. 2 is a diagram illustrating a circuit of an MDAC shown in FIG. 1.
Figures 3, 4:
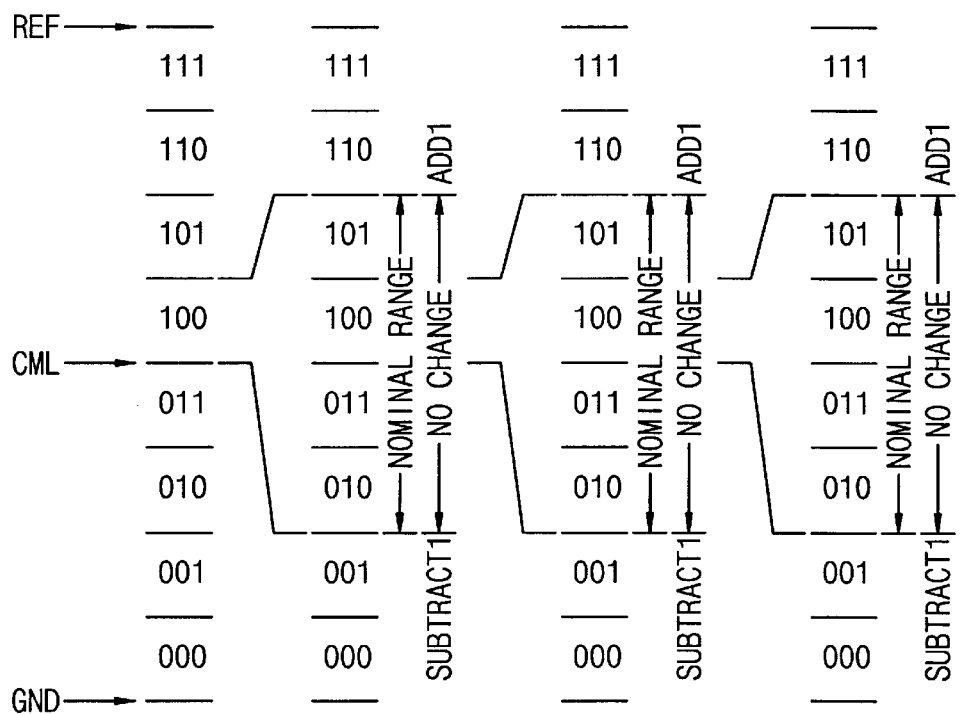
FIG. 3 is a table illustrating connection of the capacitor array shown in FIG. 2.
FIG. 4 is a diagram illustrating an expansion of FIG. 3.
Figure 6:
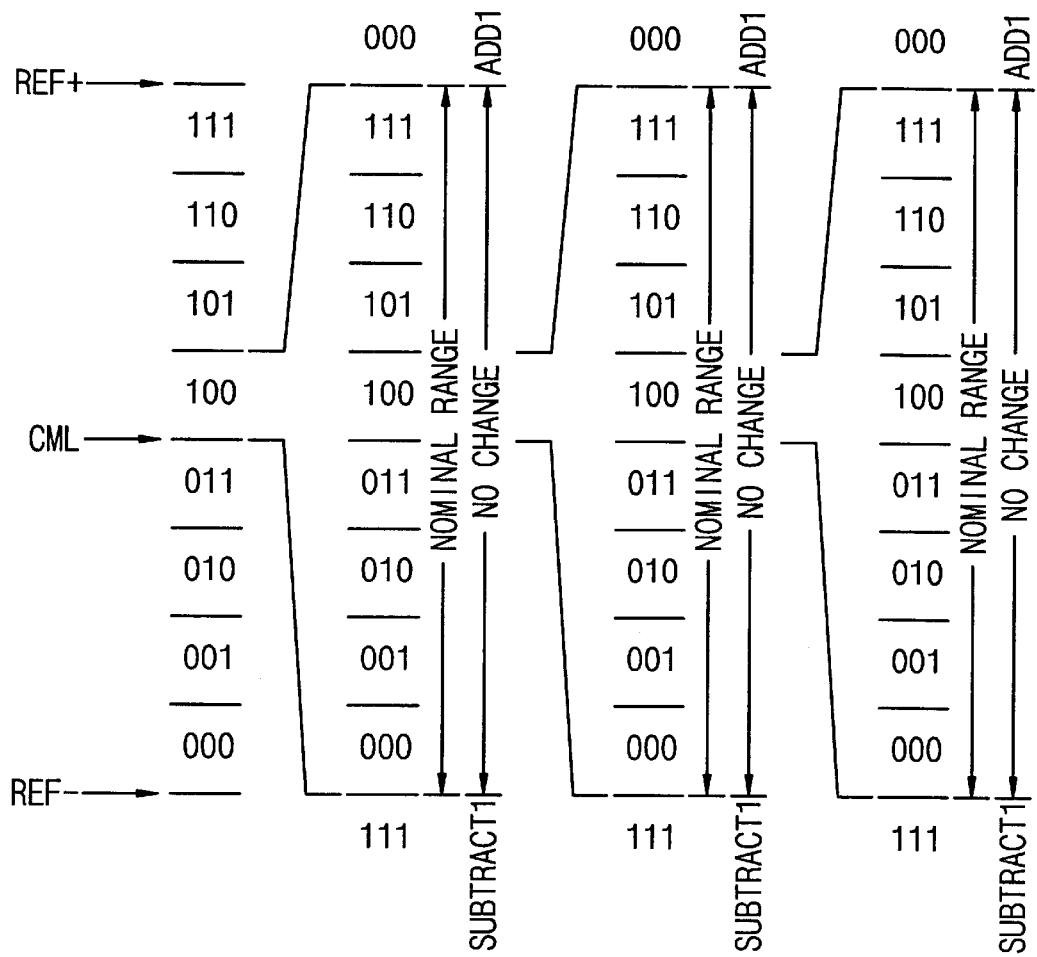
FIG. 6 is a diagram illustrating an expansion of FIG. 5.
Figure 7:
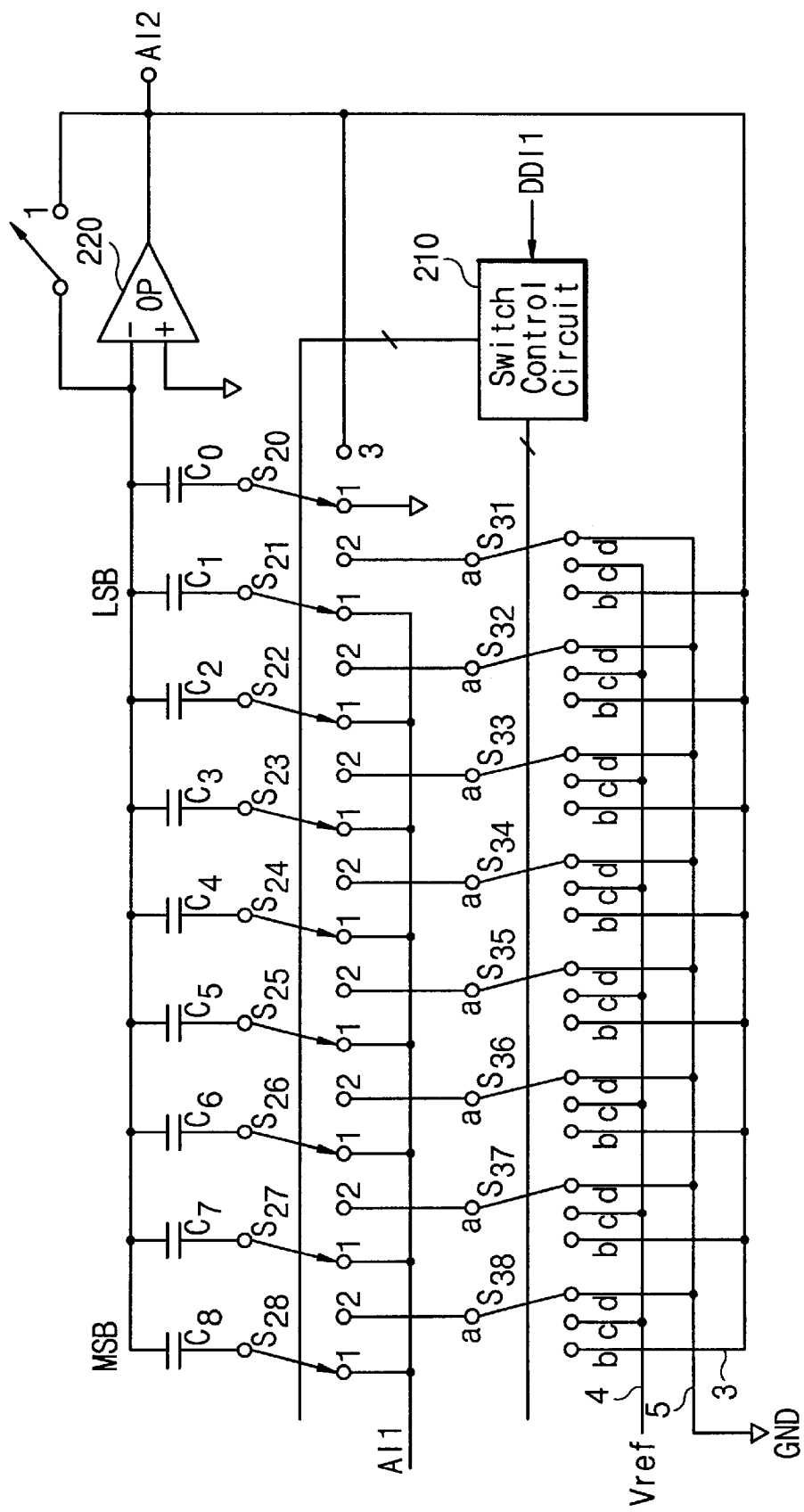
FIG. 7 is a diagram illustrating MDAC systems and methods according to a first embodiment of the present invention.

Referring now to FIG. 7, a first embodiment of Multiplying Digital-to-Analog Converters (MDACs) and methods according to the present invention is illustrated. As shown in FIG. 7, the MDAC multiplies an analog input signal at an analog input terminal AI1 and a digital input signal at a digital input terminal DDI1 to produce an analog output signal at an output terminal AI2. MDACs according to FIG. 7 may be used in pipelined Analog-to-Digital Converters (ADCs) of FIG. 1.

Still referring to FIG. 7, MDACs according to the present invention include a plurality of unit capacitors. In FIG. 7, eight unit capacitors $C_8$–$C_1$ are included. A feedback capacitor $C_0$ is also included. A circuit is also included that connects the unit capacitors $C_1$–$C_8$ to the analog input terminal AI1 during the first time interval and then selectively connects the unit capacitors $C_1$–$C_8$ to one of a first reference voltage the $V_{ref}$, a second reference voltage such as ground voltage GND and the analog output terminal AI2 during a second time interval in response to the digital input signal at the digital input terminal DDI1. A circuit also connects the feedback capacitor $C_0$ to the second reference voltage GND during the first time interval and to the output terminal AI2 during the second time interval.

As shown in FIG. 7, the circuit includes a plurality of first switches $S_{21}$–$S_{28}$, a respective one of which connects a respective unit capacitor $C_1$–$C_8$ to the analog input terminal AI1 during the first time interval. A plurality of second switches $S_{31}$–$S_{38}$ is also included. A respective one of the first switches $S_{20}$–$S_{28}$ connects a respective one of the unit capacitors $C_0$–$C_8$ to a respective one of the second switches $S_{31}$–$S_{38}$ during the second time interval. A switch control circuit 210 selectively connects the second switches $S_{31}$–$S_{38}$ to one of the first reference voltage $V_{ref}$, the second reference voltage GND and the output terminal AI2 during the second time interval in response to the digital input signal at the digital input terminal DDI1. More specifically, as will be described below, the switch control circuit 210 connects one of the second switches $S_{20}$–$S_{28}$ to the output terminal and connects remaining ones of the second switches to one of the first reference voltage $V_{ref}$ and the second reference voltage GND during the second time interval. Even more specifically, the switch control circuit connects a selected one of the second switches that corresponds to the digital input signal to the output terminal. Those second switches that are more significant than the selected switch are connected to ground voltage and those second switches that are less significant than the selected second switch are connected to the reference voltage during the second time interval.

Still continuing with the description of FIG. 7, an operational amplifier 220 is also included. The operational amplifier connects the plurality of unit capacitors $C_1$–$C_8$ and the feedback capacitor $C_0$ to the analog output terminal AI2. Thus, the feedback capacitor $C_{20}$ is connected between the operational amplifier 220 and the output terminal AI2 during the second time interval.

Thus, an MDAC according to FIG. 7 comprises an operational amplifier 220 with an inverting input terminal and a non-inverting input terminal, a capacitor array consisting of $2^N$ unit capacitors $C_8$–$C_1$ with one end connected to the inverting input terminal, and a first selection circuit comprising a plurality of first switches $S_{28}$–$S_{21}$ respectively connected to the capacitors $C_8$–$C_1$. A feedback terminal 3/b, also referred to as an output terminal AI2, feeds back the signals of the capacitors to the operational amplifier 220. A second selection circuit comprising a plurality of second switches $S_{38}$–$S_{31}$ selectively connects to the reference voltage terminal 4/c, ground terminal 5/d or the feedback terminal 3/b. A switch control circuit 210 generates control signals to control the operation of the switches $S_{20}$–$S_{28}$ and $S_{31}$–$S_{38}$. The switch control circuit 210 controls the switches to selectively connect the unit capacitors with the terminal lines 3, 4, 5 in response to the digital signal received from the previous stage. The operational amplifier 220 amplifies the difference between the digitalized sampled analog signal and the analog signal to generate a first multiplied analog output signal at the analog output terminal AI2, that is applied to the next stage.

Operation of a simplified embodiment of FIG. 7 is illustrated in FIG. 8. FIG. 8 illustrates the connection of the unit capacitors in a 2-bit MDAC according to the control signal from the switch control circuit. The unit capacitors $C_4-C_1$ and the fixed feedback capacitor $C_0$ make different connections according to the digital data applied to the switch control circuit 210. When the data 11, 10, 01, 00 is input, the fixed capacitor $C_0$ is connected to the feedback line 3. When the data 11 is input to the switch control circuit 210, the corresponding capacitor $C_4$ is connected to the feedback line 3 and less significant capacitors to the right of the capacitor $C_4$ are connected to the reference voltage line 4. When data 10 is input, the corresponding capacitor $C_3$ is connected to the feedback line 3 while the less significant capacitors $C_2$, $C_1$ to the right thereof are connected with the reference voltage line 4, and the more significant capacitor $C_4$ to the left thereof is grounded. When data 01 is input to the switch control circuit 210, the capacitor $C_2$ is connected with the feedback line 3 while the less significant capacitor $C_1$ to the right thereof is connected with the reference voltage line 4, and the more significant capacitors $C_4$, $C_3$ to the left thereof are grounded. Finally, when the data 00 is input to the switch control circuit 210, the capacitor $C_1$ is connected with the feedback line 3, and the more significant capacitors $C_4-C_2$ to the left thereof are all grounded.

Referring now to FIG. 9, a 3-bit MDAC may include the eight unit capacitors $C_8-C_1$ and a fixed feedback capacitor $C_0$ connected to the inverting input terminal of the operational amplifier 220, as shown in FIG. 7. The unit capacitors $C_8-C_1$ are sequentially arranged from the Most Significant Bit (MSB) to the Least Significant Bit (LSB). The first MDAC of a pipelined ADC will now be described. It will be understood that the other MDACs are constructed and operated in the same manner.

In operation, the switch control circuit 210 controls the switches $S_{21}-S_{28}$ to connect the unit capacitors $C_1-C_8$ with the first switch terminals 1 during the first time interval of a first clock pulse, so that the unit capacitors perform sampling of the input analog signal. During the second time interval of a second clock pulse, the switch control circuit 210 controls the switches $S_{28}-S_{21}$ to connect the unit capacitors with the second switch terminals 2 while selectively connecting the capacitors $C_1-C_8$ with the feedback line 3, reference voltage line 4 or ground line 5 in response to the first digital data DDI of the first ADC 120. Consequently, the first MDAC amplifies the difference between the values of the first digital data DDI1 and the analog signal AI1 to generate the first multiplied analog signal AI2. The capacitors are connected as shown in FIG. 9.

For example, if the digital input data of the digital input terminal DDI1 is 100, the switch control circuit 210 controls the switches $S_{21}-S_{28}$ to connect the capacitors to the second switch terminals 2 at the second interval while connecting the capacitor $C_5$ with the feedback terminal 3/a. Then, the less significant capacitors $C_4-C_1$ to the right of the capacitor $C_5$ are connected through the switches $S_{24}-S_{21}$, $S_{34}-S_{31}$ to the reference voltage terminal 4/c while the more significant capacitors $C_8-C_6$ to the left thereof are connected through the switches $S_{28}-S_{26}$, $S_{38}-S_{36}$ to the ground terminal 5/d. Such an MDAC employs a feedback capacitor structure including a fixed feedback capacitor $C_0$ and a unit feedback capacitor selected from the unit capacitors. In the present embodiment, the relationship between $V_1$, $V_2$ and Vdrop may be expressed by the following Equations.

$$V_1 = 4 \frac{C}{C(1+\varepsilon_1) + C(1+\varepsilon_0)} \times \frac{Vref}{4} = \frac{Vref}{2+\varepsilon_1+\varepsilon_2} \quad (9)$$

$$V_2 = 4 \frac{C}{2+\varepsilon_2+\varepsilon_0} \times \frac{Vref}{4} - \frac{(1+\varepsilon_1)}{2+\varepsilon_{20}+\varepsilon_0} Vref = \frac{-\varepsilon_1 Vref}{2+\varepsilon_0+\varepsilon_2} \quad (10)$$

$$V_{drop} = V_1 - V_2 = \frac{Vref}{2+\varepsilon_1+\varepsilon_0} - \frac{-\varepsilon_1 Vref}{2+\varepsilon_2+\varepsilon_0} = \quad (11)$$
$$\frac{2+\varepsilon_2+\varepsilon_0+2\varepsilon_1+\varepsilon_1^2+\varepsilon_1\varepsilon_0}{4+2\varepsilon_2+4\varepsilon_0+2\varepsilon_1+\varepsilon_1\varepsilon_2+\varepsilon_1\varepsilon_0+\varepsilon_2\varepsilon+\varepsilon_0^2} Vref =$$
$$\frac{1}{2}\left[1 - \frac{1}{2}\varepsilon_0 + \frac{1}{2}\varepsilon_1\right] \times Vref.$$

As shown by the above Equations, it will be noted that the capacitor error may be reduced to $\varepsilon_2$, $3\varepsilon_0$ compared to a conventional MDAC. In addition, if the value of $\varepsilon_0$ is minimized, the value of the overall capacitor error may be reduced to about ½.

Figure 10:
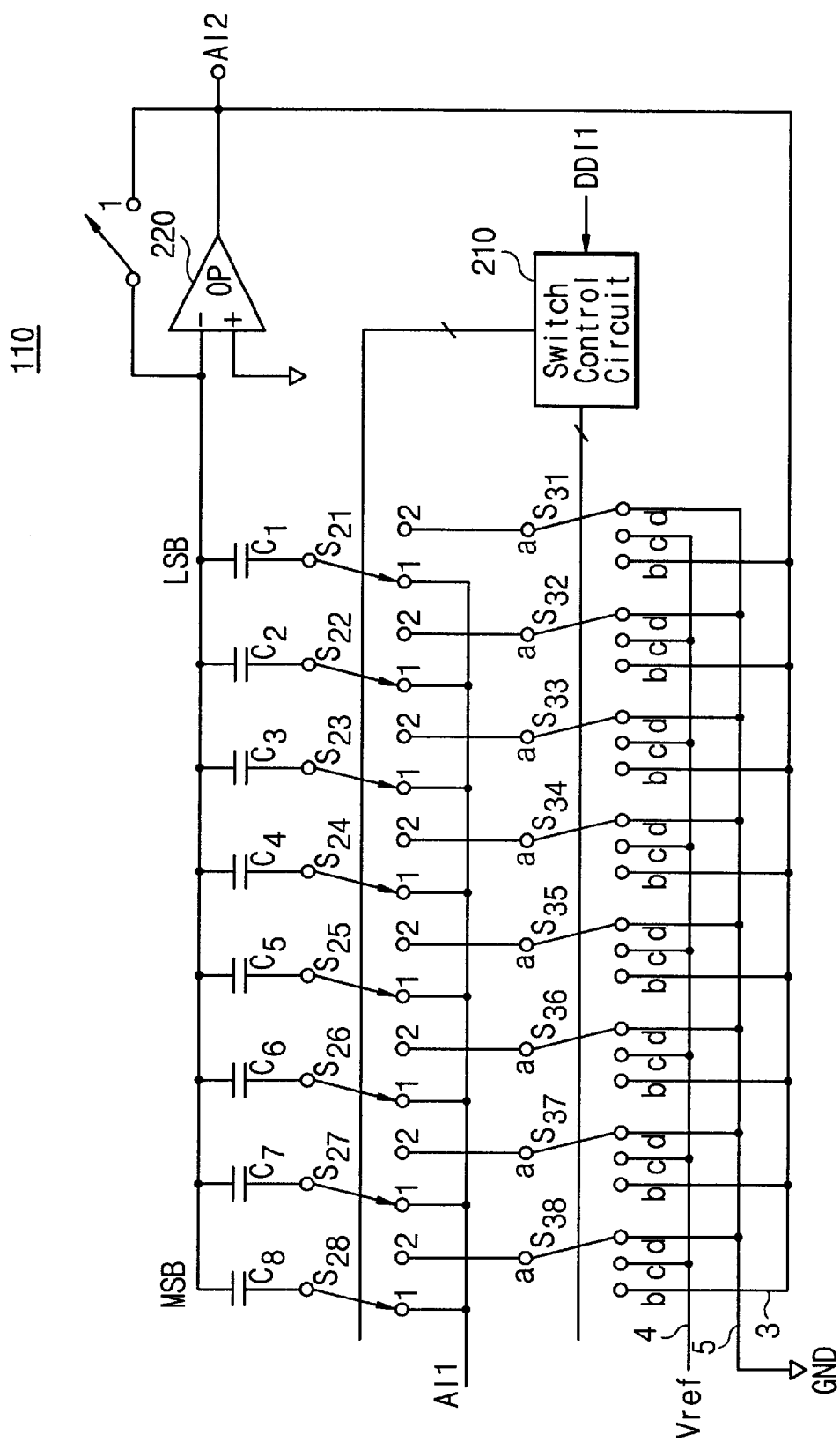
FIG. 10 is a diagram illustrating MDAC systems and methods according to a second embodiment of the present invention.

A second embodiment of an MDAC as shown in FIG. 10 has the same construction as the first embodiment except that the fixed feedback capacitor shown in FIG. 7 may be omitted. Operation of a 2-bit MDAC according to this embodiment has the capacitor connection as shown in FIG. 11. The unit capacitors constituting the capacitor array are selectively connected to the feedback terminal b, reference voltage terminal c and ground terminal d, as shown in FIG. 10. When the switch control circuit 210 receives the four digital input data 11, 10, 01, 00, the capacitors $C_4-C_1$ make different connections with the upper data 11, 10 and the lower data 01, 00. The more significant capacitors $C_4$, $C_3$ corresponding to the upper data 11, 10 are connected with the feedback line 3. Thus, when applying data 11, the less significant capacitors $C_3-C_1$ to the right of the capacitor $C_4$ are connected with the reference voltage line 4. Applying data 10, the less significant capacitors $C_2$, $C_1$ to the right of the capacitor $C_3$ are connected with the reference terminal line 4 while the capacitor $C_4$ to the left thereof is grounded.

When the lower data 01, 00 is applied to the switch control circuit 210, the capacitor $C_3$ is again connected with the feedback terminal line 3 as in the previous case. However, the less significant capacitors $C_2$, $C_1$ to the right of the capacitor $C_3$ are grounded, which is reversed compared to the upper data application. The capacitor $C_4$ to the left thereof is connected to the reference terminal line 4. When applying data 00, the capacitor $C_4$ is connected to the feedback line 3 while the less significant capacitors $C_3-C_1$ to the right thereof are all connected to the ground line 5. Thus, the switch control circuit is responsive to the most significant bit of the digital input signal to connect the more significant capacitors to a first reference voltage and connect the less significant capacitors to a second reference voltage, or to connect the more significant capacitors to the second reference voltage and connect the less significant capacitors to the first reference voltage during the second time interval.

Describing the operation of the 3-bit MDAC with reference to FIGS. 10 and 12, the capacitors $C_8$, $C_7$, $C_6$, $C_5$ diagonally arranged in the negative slope line corresponding to the upper four digital data 111, 110, 101, 100 of the eight digital data are connected to the feedback terminal line 3 as in the case of the 2-bit MDAC. Sequentially applying the four upper digital data 111, 110, 101, 100 to the switch control circuit 210, the less significant capacitors to the right of the capacitor connected to the feedback terminal line 3, are connected to the reference voltage line 4. The more significant capacitors to the left thereof are connected to the ground line 5.

Further, applying the four lower digital data 011 to 000 of the eight digital data 111 to 000 to the switch control circuit 210, the capacitors 011/$C_5$, 010/$C_6$, 001/$C_7$, 000/$C_8$ diagonally arranged in a positive slope line, are connected to the feedback terminal line 3. Sequentially applying the four lower digital data 011 to 000 to the switch control circuit 210, the less significant capacitors to the right of the capacitor connected to the feedback terminal line 3, are connected to the ground line 5. The more significant capacitors to the left thereof are connected to the reference voltage line 4. Thus, when applying N bits ($2^N$ values of digital data) to the switch control circuit 210, the arrangement of the capacitors corresponding to the upper $2^N/2$ digital data values is different from that corresponding to the lower $2^N/2$ digital data, on both sides of the capacitor that is connected to the feedback terminal line 3.

Figure 13A:
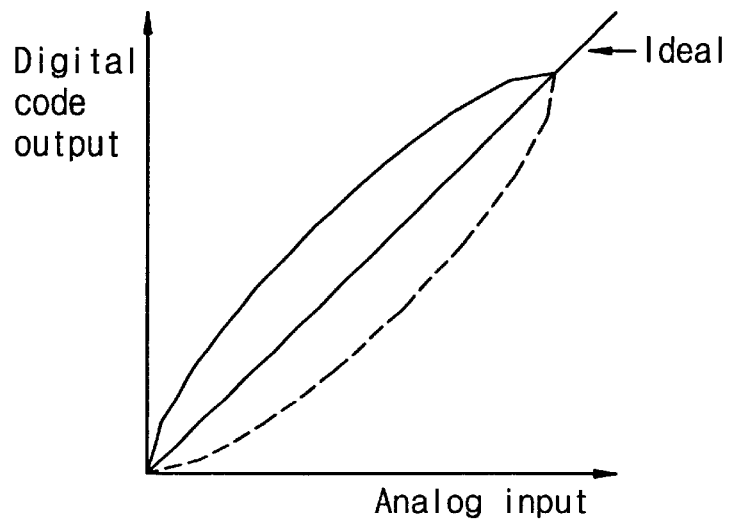
FIGS. 13A and 13B are graphs illustrating a comparison of characteristics of a conventional pipelined ADC and a pipelined ADC according to the invention.
Figure 13B:
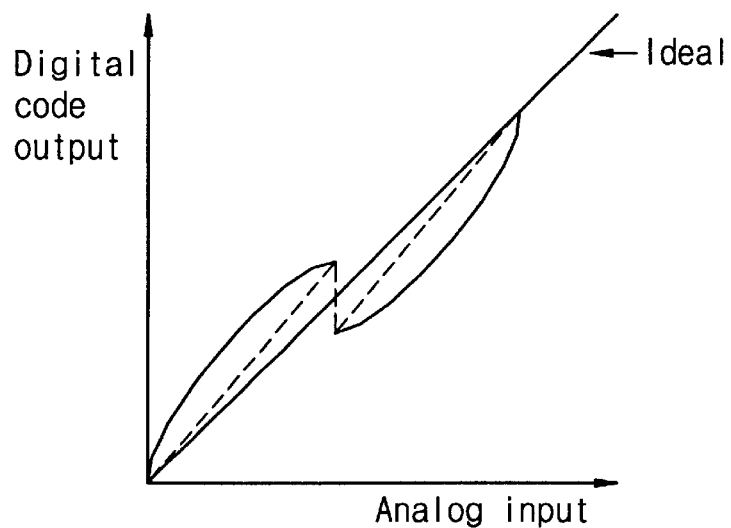

Referring to FIGS. 13A and 13B, the maximum standard deviation of DNL occurs at the center I=8 of a conventional MDAC based on the unit capacitor array. The standard deviation of DNL of an MDAC according to the invention may be 0.38LSB as shown in FIG. 13B. This can provide about 30% reduced error compared to the standard deviation 0.56LSB of DNL of a conventional MDAC.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multiplying Digital-to-Analog Converter (MDAC) that multiplies an analog input signal at an analog input terminal and a digital input signal at a digital input terminal to produce an analog output signal at an output terminal, the MDAC comprising:

a plurality of unit capacitors;

a feedback capacitor that is separate from the plurality of unit capacitors; and a circuit that connects the unit capacitors to the analog input terminal during a first time interval and that selectively connects the unit capacitors to one of a first reference voltage, a second reference voltage and the output terminal during a second time interval in response to the digital input signal at the digital input terminal, the circuit further connecting the feedback capacitor that is separate from the plurality of unit capacitors to the second reference voltage during the first time interval and to the output terminal during the second time interval.

2. The MDAC according to claim 1 wherein the circuit comprises:

a plurality of first switches, a respective one of which connects a respective unit capacitor to the analog input terminal during the first time interval;

a plurality of second switches, a respective one of the first switches connecting a respective one of the unit capacitors to a respective one of the second switches during the second time interval; and a switch control circuit that selectively connects the second switches to one of the first reference voltage, the second reference voltage and the output terminal during the second time interval in response to the digital input signal at the digital input terminal.

3. The MDAC according to claim 2 wherein the switch control circuit connects one of the second switches to the output terminal, and connects remaining ones of the second switches to one of the first reference voltage and the second reference voltage during the second time interval in response to the digital input signal at the digital input terminal.

4. The MDAC according to claim 3:

wherein the plurality of second switches are arranged from a most significant bit to a least significant bit;

wherein the second reference voltage is ground voltage; and wherein the switch control circuit connects a selected one of the second switches that corresponds to the digital input signal to the output terminal, connects more significant second switches to ground voltage and connects less significant second switches to the first reference voltage during the second time interval.

5. The MDAC according to claim 3:

wherein the plurality of capacitors, the plurality of first switches and the plurality of second switches are $2^N$ capacitors, $2^N$ first switches and $2^N$ second switches, respectively, where N is the number of bits in the digital input signal;

wherein the $2^N$ second switches are arranged from a most significant bit to a least significant bit;

wherein the second reference voltage is ground voltage; and wherein the switch control circuit connects a selected one of the $2^N$ second switches that corresponds to the value of the N bit digital input signal to the output terminal, connects the second switches that are more significant than the selected one of the $2^N$ second switches to ground voltage and connects the second switches that are less significant than the selected one of the $2^N$ second switches to the first reference voltage during the second time interval.

6. The MDAC according to claim 1 further comprising an operational amplifier that connects the plurality of unit capacitors and the feedback capacitor to the output terminal.

7. The MDAC according to claim 6 wherein the feedback capacitor is connected between the operational amplifier and the second reference voltage during the first time interval and is connected between the operational amplifier and the output terminal during the second time interval.

8. A pipelined Analog-to-Digital Converter (ADC) system comprising:

a plurality of Multiplying Digital-to-Analog Converters (MDAC) each of which multiplies an analog input signal at an analog input terminal thereof and a digital input signal at a digital input terminal thereof to produce an analog output signal at an output terminal thereof, the MDACs being serially connected such that the analog output terminal of a preceding MDAC is connected to the analog input terminal of a succeeding MDAC; and a plurality of ADCs, a respective one of which is connected between the analog input terminal and the digital input terminal of a respective one of the MDACs, each of the MDACs comprising a plurality of unit capacitors, a feedback capacitor that is separate from the plurality of unit capacitors, and a circuit that connects the unit capacitors to the analog, input terminal during a first time interval and that selectively connects the unit capacitors to one of a first reference voltage, a second reference voltage and the output terminal during a second time interval in response to the digital input signal at the digital input terminal, the circuit further connecting the feedback capacitor that is separate from the plurality of unit capacitors to the second reference voltage during the first time interval and to the output terminal during the second time interval.

9. The pipelined ADC system according to claim 8 wherein the circuit comprises:
   a plurality of first switches, a respective one of which connects a respective unit capacitor to the analog input terminal during the first time interval;
   a plurality of second switches, a respective one of the first switches connecting a respective one of the unit capacitors to a respective one of the second switches during the second time interval; and
   a switch control circuit that selectively connects the second switches to one of the first reference voltage, the second reference voltage and the output terminal during the second time interval in response to the digital input signal at the digital input terminal.

10. The pipelined ADC system according to claim 9 wherein the switch control circuit connects one of the second switches to the output terminal, and connects remaining ones of the second switches to one of the first reference voltage and the second reference voltage during the second time interval in response to the digital input signal at the digital input terminal.

11. The pipelined ADC system according to claim 10:
   wherein the plurality of second switches are arranged from a most significant bit to a least significant bit;
   wherein the second reference voltage is around voltage; and
   wherein the switch control circuit connects a selected one of the second switches that corresponds to the digital input signal to the output terminal, connects more significant second switches to ground voltage and connects less significant second switches to the first reference voltage during the second time interval.

12. The pipelined ADC system according to claim 10:
   wherein the plurality of capacitors, the plurality of first switches and the plurality of second switches are $2^N$ capacitors, $2^N$ first switches and $2^N$ second switches, respectively, where N is the number of bits in the digital input signal;
   wherein the $2^N$ second switches are arranged from a most significant bit to a least significant bit;
   wherein the second reference voltage is ground voltage; and
   wherein the switch control circuit connects a selected one of the $2^N$ second switches that corresponds to the value of the N bit digital input signal to the output terminal, connects the second switches that are more significant than the selected one of the $2^N$ second switches to ground voltage and connects the second switches that are less significant than the selected one of the $2^N$ second switches to the first reference voltage during the second time interval.

13. The pipelined ADC system according to claim 8 further comprising an operational amplifier that connects the plurality of unit capacitors and the feedback capacitor to the output terminal.

14. The pipelined ADC system according to claim 13 wherein the feedback capacitor is connected between the operational amplifier and the second reference voltage during the first time interval and is connected between the operational amplifier and the output terminal during the second time interval.

15. The pipelined ADC system according to claim 8 further comprising a correction and data output circuit that is connected to the digital input terminals of the MDACs to produce digital output data.

16. A Multiplying Digital-to-Analog Converter (MDAC) that multiplies an analog input signal at an analog input terminal and a digital input signal at a digital input terminal to produce an analog output signal at an output terminal, the MDAC comprising:
   a plurality of unit capacitors;
   a feedback capacitor that is separate from the plurality of unit capacitors; and
   means for connecting the unit capacitors to the analog input terminal during a first time interval, for selectively connecting the unit capacitors to one of a first reference voltage a second reference voltage and the output terminal during a second time interval in response to the digital input signal at the digital input terminal, for connecting the feedback capacitor that is separate from the plurality of unit capacitors to the second reference voltage during the first time interval and for connecting the feedback capacitor to the output terminal during the second time interval.

17. The MDAC according to claim 16 wherein the means for connecting comprises means for connecting one of the unit capacitors to the output terminal, and for connecting remaining ones of the unit capacitors to one of the first reference voltage and the second reference voltage during the second time interval in response to the digital input signal at the digital input terminal.

18. The MDAC according to claim 17:
   wherein the plurality of unit capacitors are arranged from a most significant bit to a least significant bit;
   wherein the second reference voltage is ground voltage; and
   wherein the means for connecting comprises means for connecting a selected one of the unit capacitors that corresponds to the digital input signal to the output terminal, for connecting more significant ones of the capacitors to ground voltage and for connecting less significant ones of the capacitors to the first reference voltage during the second time interval.

19. A pipelined Analog-to-Digital Converter (ADC) system comprising:
   a plurality of Multiplying Digital-to-Analog Converters (MDAC) each of which multiplies an analog input signal at an analog input terminal thereof and a digital input signal at a digital input terminal thereof to produce an analog output signal at an output terminal thereof, the MDACs being serially connected such that the analog output terminal of a preceding MDAC is connected to the analog input terminal of a succeeding MDAC; and
   a plurality of ADCs, a respective one of which is connected between the analog input terminal and the digital input terminal of a respective one of the MDACs;
   each of the MDACs comprising a plurality of unit capacitors, a feedback capacitor that is separate from the plurality of unit capacitors and means for connecting the unit capacitors to the analog input terminal during a first time interval, for selectively connecting the unit capacitors to one of a first reference voltage, a second reference voltage and the output terminal during a second time interval in response to the digital input signal at the digital input terminal, for connecting the feedback capacitor that is separate from the plurality of unit capacitors to the second reference voltage during the first time interval and for connecting the feedback capacitor to the output terminal during the second time interval.

20. The pipelined ADC system according to claim 19 wherein the means for connecting comprises means for connecting one of the unit capacitors to the output terminal, and for connecting remaining ones of the unit capacitors to one of the first reference voltage and the second reference voltage during the second time interval in response to the digital input signal at the digital input terminal.

21. The pipelined ADC system according to claim 20:

wherein the plurality of unit capacitors are arranged from a most significant bit to a least significant bit;

wherein the second reference voltage is ground voltage; and wherein the means for connecting comprises means for connecting a selected one of the unit capacitors that corresponds to the digital input signal to the output terminal, for connecting more significant ones of the unit capacitors to ground voltage and for connecting less significant ones of the unit capacitors to the first reference voltage during the second time interval.

22. The pipelined ADC system according to claim 19 further comprising means for producing digital output data from the digital input signals.

23. A method of multiplying an analog input signal at an analog input terminal and a digital input signal at a digital input terminal to produce an analog output signal at an output terminal using a plurality of unit capacitors and a feedback capacitor that is separate from the plurality of unit capacitors, the method comprising the steps of:

connecting the unit capacitors to the analog input terminal during a first time interval;

connecting the feedback capacitor that is separate from the plurality of unit capacitors to a second reference voltage during the first time interval;

selectively connecting the capacitors to one of a first reference voltages, the second reference voltage and the output terminal during a second time interval in response to the digital input signal at the digital input terminal; and connecting the feedback capacitor that is separate from the plurality of unit capacitors to the output terminal during the second time interval.

24. The method according to claim 23 wherein the step of selectively connecting comprises the steps of:

connecting one of the unit capacitors to the output terminal in response to the digital input signal at the digital input terminal; and connecting remaining ones of the unit capacitors to one of the first reference voltage and the second reference voltage in response to the digital input signal at the digital input terminal.

25. The method according to claim 23 wherein the plurality of unit capacitors are arranged from a most significant bit to a least significant bit and wherein the second reference voltage is ground voltage, the step of selectively connecting comprising the steps of:

connecting a selected one of the unit capacitors that corresponds to the digital input signal to the output terminal;

connecting more significant ones of the unit capacitors to ground voltage; and connecting less significant ones of the unit capacitors to the first reference voltage.

26. A Multiplying Digital-to-Analog Converter (MDAC) that multiplies an analog input signal at an analog input terminal and an N bit digital input signal at a digital input terminal to produce an analog output signal at an output terminal, the MDAC comprising:

$2^N$ capacitors that are arranged from a most significant bit to a least significant bit of the N bit digital input signal; and a circuit that connects the $2^N$ capacitors to the analog input terminal during a first time interval, that selectively connects one of the $2^N/2$ most significant capacitors to the output terminal during a second time interval in response to the N bit digital input signal at the digital input terminal, and that connects the more significant capacitors than the one of the $2^N/2$ most significant capacitors to a first reference voltage and connects the less significant capacitors than the one of the $2^N/2$ most significant capacitors to a second reference voltage, or connects the more significant capacitors than the one of the $2^N/2$ most significant capacitors to the second reference voltage and connects the less significant capacitors than the one of the $2^N/2$ most significant capacitors to the first reference voltage during the second time interval in response to the N bit digital input signal at the digital input terminal.

27. The MDAC according to claim 26 wherein the circuit is responsive to the most significant bit of the N bit digital input signal to connect the more significant capacitors than the one of the $2^N/2$ most significant capacitors to a first reference voltage and connect the less significant capacitors than the one of the $2^N/2$ most significant capacitors to a second reference voltage, or to connect the more significant capacitors than the one of the $2^N/2$ most significant capacitors to the second reference voltage and connect the less significant capacitors than the one of the $2^N/2$ most significant capacitors to the first reference voltage during the second time interval.

28. The MDAC according to claim 26 wherein the circuit comprises:

$2^N$ first switches, a respective one of which connects a respective capacitor to the analog input terminal during the first time interval;

$2^N$ second switches, a respective one of the $2^N$ first switches connecting a respective one of the $2^N$ capacitors to a respective one of the $2^N$ second switches during the second time interval; and a switch control circuit that selectively connects one of the $2^N/2$ most significant second switches to the output terminal during the second time interval in response to the N bit digital input signal at the digital input terminal, and that connects the more significant second switches to the first reference voltage and connects the less significant second switches to the second reference voltage, or connects the more significant second switches to the second reference voltage and connects the less significant second switches to the first reference voltage during the second time interval in response to the N bit digital input signal at the digital input terminal.

29. A pipelined Analog-to-Digital Converter (ADC) system comprising:

a plurality of Multiplying Digital-to-Analog Converters (MDAC) each of which multiplies an analog input signal at an analog input terminal thereof and an N bit digital input signal at a digital input terminal thereof to produce an analog output signal at an output terminal thereof, the MDACs being serially connected such that the analog output terminal of a preceding MDAC is connected to the analog input terminal of a succeeding MDAC; and a plurality of ADCs, a respective one of which is connected between the analog input terminal and the digital input terminal of a respective one of the MDACs;

each of the MDACs comprising $2^N$ capacitors that are arranged from a most significant bit to a least significant bit of the N bit digital input signal, and a circuit that connects the $2^N$ capacitors to the analog input terminal during a first time interval, that selectively connects one of the $2^N/2$ most significant capacitors to the output terminal during a second time interval in response to the N bit digital input signal at the digital input terminal, and that connects the more significant capacitors than the one of the $2^N/2$ most significant capacitors to a first reference voltage and connects the less significant capacitors than the one of the $2^N/2$ most significant capacitors to a second reference voltage, or connects the more significant capacitors than the one of the $2^N/2$ most significant capacitors to the second reference voltage and connects the less significant capacitors than the one of the $2^N/2$ most significant capacitors to the first reference voltage during the second time interval in response to the N bit digital input signal at the digital input terminal.

30. The pipelined ADC system according to claim 29 wherein the circuit is responsive to the most significant bit of the N bit digital input signal to connect the more significant capacitors than the one of the $2^N/2$ most significant capacitors to a first reference voltage and connect the less significant capacitors than the one of the $2^N/2$ most significant capacitors to a second reference voltage, or to connect the more significant capacitors than the one of the $2^N/2$ most significant capacitors to the second reference voltage and connect the less significant capacitors than the one of the $2^N/2$ most significant capacitors to the first reference voltage during the second time interval.

31. The pipelined ADC system according to claim 29 wherein the circuit comprises:

$2^N$ first switches, a respective one of which connects a respective capacitor to the analog input terminal during the first time interval;

$2^N$ second switches, a respective one of the $2^N$ first switches connecting a respective one of the $2^N$ capacitors to a respective one of the $2^N$ second switches during the second time interval; and a switch control circuit that selectively connects one of the $2^N/2$ most significant second switches to the output terminal during the second time interval in response to the N bit digital input signal at the digital input terminal, and that connects the more significant second switches to the first reference voltage and connects the less significant second switches to the second reference voltage, or connects the more significant second switches to the second reference voltage and connects the less significant second switches to the first reference voltage during the second time interval in response to the N bit digital input signal at the digital input terminal.

* * * * *